(12) United States Patent
Nishikawa et al.

(10) Patent No.: US 7,525,389 B2
(45) Date of Patent: Apr. 28, 2009

(54) SIGNAL AMPLIFIER CIRCUIT WITH A LIMITING VOLTAGE DEVICE

(75) Inventors: Mutsuo Nishikawa, Matsumoto (JP); Katsumichi Ueyanagi, Matsumoto (JP); Katsuyuki Uematsu, Hata-machi (JP); Yuko Fujimoto, Toyama (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 88 days.

(21) Appl. No.: 11/783,327

(22) Filed: Apr. 9, 2007

(65) Prior Publication Data

US 2007/0290761 A1 Dec. 20, 2007

(30) Foreign Application Priority Data

Apr. 20, 2006 (JP) ............................... 2006-116583

(51) Int. Cl.
*H03F 1/52* (2006.01)
(52) U.S. Cl. ..................................... 330/298; 330/207 P
(58) Field of Classification Search ............... 330/207 P, 330/298
See application file for complete search history.

(56) References Cited

U.S. PATENT DOCUMENTS 6,831,514 B2 * 12/2004 Waller et al. ................. 330/255
2003/0197513 A1 10/2003 Uematsu et al. ............. 324/522

FOREIGN PATENT DOCUMENTS

JP H05-321747 12/1993

* cited by examiner

*Primary Examiner*—Steven J Mottola
(74) *Attorney, Agent, or Firm*—Manabu Kanesaka

(57) ABSTRACT

A signal amplifier circuit includes a negative feedback amplifier circuit having an output terminal, a first voltage limiting device for limiting the output voltage from the negative feedback amplifier circuit, a second voltage limiting device for limiting the output voltage from the negative feedback amplifier circuit, a first reference voltage supply applying a first reference voltage to the first voltage limiting device, a second reference voltage supply applying a second reference voltage to the second voltage limiting device. The first voltage limiting device is configured to fix a lower limit saturation voltage at the first reference voltage. The second voltage limiting device is configured to fix an upper limit saturation voltage at the second reference voltage.

11 Claims, 10 Drawing Sheets

SIGNAL AMPLIFIER CIRCUIT WITH A LIMITING VOLTAGE DEVICE

BACKGROUND OF THE INVENTION AND RELATED ART STATEMENT

The present invention relates to a signal amplifier circuit for electrical and electronic equipments used in automobiles, motorcycles and industries. Specifically, the present invention relates to a signal amplifier circuit for semiconductor physical quantity sensors used in automobiles and motorcycles.

In these days, the mechanical controls performed by mechanical parts are quickly being replaced by electrical and electronic controls performed by electrical and electronic parts in the fields of automobiles and motorcycles. Moreover, the conventional electronic parts are being replaced by more precise and multifunctional products for facilitating higher grade control.

For example, it is required for the pressure sensors, used for measuring the pressure inside the intake manifold or for measuring the brake oil pressure, to perform not only the pressure measuring function but also the function of detecting the troubles relating to the pressure measuring function (that is the self-diagnostic function, hereinafter referred to simply as the "diagnostic function").

FIG. 10 is a block diagram of a conventional pressure sensor illustrating that the pressure sensor includes a pressure detecting section and signal amplifier circuit 10c. The pressure detecting section converts the pressure to an electrical signal by piezoelectric effects. The electrical signal is processed in signal amplifier circuit 10c and the processed signal is outputted from output terminal 02 of signal amplifier circuit 10c (that is also the output terminal of the pressure sensor) to an engine control unit (hereinafter referred to as an "ECU").

The diagnostic function exhibited by the pressure sensor is the function of detecting the breakage of wirings (such as a wire bonding, a lead frame, and a harness) connecting the pressure sensor and the ECU to each other and transmitting the detected wiring breakage to the ECU. The diagnostic function realizes a fail safe function that detects a trouble, if present, and prevents larger troubles from occurring.

FIG. 11 is a diagram (graph) illustrating the relationship between the output characteristics of the pressure sensor and the diagnostic function. In FIG. 11, the X-axis represents the pressure (in kPa) that the pressure sensor measures and the Y-axis the output voltage (in V) outputted from the pressure sensor. The following brief descriptions will be followed later by more detailed descriptions.

The conventional pressure sensor does not exhibit any diagnostic function and outputs a certain voltage corresponding to the measured pressure. More specifically, the conventional pressure sensor exhibits only the function of outputting a certain voltage within the range between Vb and Vc (the steady output range), as shown in FIG. 11.

In contrast, the pressure sensor that includes the diagnostic function is designed not only to output a voltage within the steady output range but also to output a voltage lower than Va or higher than Vd (a voltage in any of the diagnostic ranges) in the event of a wire breakage. Because the ECU receives a voltage in any of the diagnostic ranges, it is detected that the pressure sensor is in trouble.

For realizing the diagnostic function in a pressure sensor, the following two technical means are necessary.

(1) A means for outputting a voltage in the diagnostic ranges when wiring breakage such as wire breakage and harness breakage is caused.

(2) A means for not outputting any voltage in the diagnostic ranges when the pressure sensor is in the normal state.

Here, the description of the means (1) will be omitted, since the means (1) is disclosed in the Patent Document 1 disclosed herein.

For the means (2), the conventional method employs most generally the saturation voltages of a signal processing circuit (operational amplifier 41 for signal outputting in FIG. 10).

FIG. 12 is a block diagram of a signal amplifier circuit used as a general signal processing circuit for a pressure sensor and illustrates wherein signal amplifier circuit 10c is essentially negative feedback amplifier circuit 40. Negative feedback amplifier circuit 40 includes a differential amplifier circuit 40a and resistor 46a. Differential amplifier circuit 40a includes operational amplifier 41 and four resistors 42, 43, 44, and 45. Signal amplifier circuit 10c includes input terminals including Vin+ terminal 011 for positive input and Vin− terminal 012 for negative input. Signal amplifier circuit 10c also includes Vout terminal 02 working as an output terminal and third reference voltage supply 70 feeding an offset voltage. Resistors 44 and 45 are connected in series between Vin+ terminal 011 and third reference voltage supply 70. The connection point of resistors 44 and 45 is connected to the non-inverting input terminal (+terminal) of operational amplifier 41.

Resistors 42, 43, and 46a are connected in series between Vin− terminal 012 and output terminal 41b of operational amplifier 41. The connection point of resistors 42 and 43 is connected to the inverting input terminal (−terminal) of operational amplifier 41. The connection point of resistors 43 and 46a is connected to Vout terminal 02.

The output voltage Vout of signal amplifier circuit 10c is obtainable approximately from the following formula, in which the voltage of Vout terminal 02 is represented by Vout, the voltage of Vin+ terminal 011 by Vin+, the voltage of Vin− terminal 012 by Vin−, the resistance value of resistor 43 by R43, the resistance value of resistor 42 by R42, and the voltage of third reference voltage supply 70 by Vref 3.

$$\text{Vout} = (\text{Vin+} - \text{Vin−}) \times (R43 \div R42) + \text{Vref } 3$$

In signal amplifier circuit 10c, the upper limit saturation voltage and the lower limit saturation voltage of the output thereof are determined by the upper and lower limit saturation voltages of operational amplifier 41 and the voltage drop caused across resistor 46a. In greater detail, the upper and lower limit saturation voltages of operational amplifier 41 and the voltage drop caused across resistor 46a depend on the following factors.

Upper and lower limit saturation voltages of operational amplifier 41

(1) The saturation voltages of the transistors used in the output stage of operational amplifier 41

(2) The impedance components of the transistors used in the output stage of operational amplifier 41 Voltage drop across resistor 46a (3) The resistance value of resistor 46a (4) The current flowing through resistor 46a (≈the load current flowing into and out of Vout terminal 02)

FIG. 13 is a diagram describing the lower limit saturation voltage and FIG. 14 is a diagram describing the upper limit saturation voltage.

Referring now to FIG. 13, the lower limit saturation voltage of the output is the sum of the voltage V6 of transistor Tr2

(MOSFET) in the output stage of operational amplifier 41 and the voltage drop V7 across resistor 46a. The voltage V6 of transistor Tr2 includes the ground potential, i.e. 0 V, which is the source potential of transistor Tr2, the ON-voltage of transistor Tr2 caused by the sink current I03 of operational amplifier 41, and the voltage caused by the impedance of transistor Tr2. The lower limit saturation voltage of the output is around 0.2 V.

Referring now to FIG. 14, the upper limit saturation voltage of the output is obtained by subtracting the voltage V5, consisted of the ON-voltage of transistor Tr1 (MOSFET) in the output stage of operational amplifier 41 caused by the source current I13 of operational amplifier 41 and the voltage caused by the impedance of transistor Tr1, and the voltage drop V8 across resistor 46a from the drain voltage of transistor Tr1, i.e. the power supply voltage VDD, which is around 5 V. The upper limit saturation voltage of the output is around 4.8 V.

As described above, the factors that determine the saturation voltages of the output from conventional signal amplifier circuit 10c depend on the characteristics of transistors Tr1 and Tr2 constituting operational amplifier 41 and the resistance value of resistor 46a. For example, as the resistance value of resistor 46a and the voltages V5 and V6 of transistors Tr1 and Tr2 lower, the lower limit saturation voltage lowers and the upper limit saturation voltage rises.

Contrary to this, as the resistance value of resistor 46a and the voltages V5 and V6 of transistors Tr1 and Tr2 rise, the lower limit saturation voltage rises and the upper limit saturation voltage lowers.

Since the lower and upper limit saturation voltages depend on the characteristics of transistors Tr1 and Tr2 constituting operational amplifier 41 and the resistance value of resistor 46a, as described above, variations are liable to be caused in the lower and upper limit saturation voltages due to the variations caused by manufacturing transistors Tr1 and Tr2 and resistor 46a (hereinafter referred to simply as the "manufacturing variations") and the temperature dependence of the transistors' characteristics and the resistor's resistance value (hereinafter referred to simply as the "temperature dependence"). It is difficult to confine the lower and upper limit saturation voltages within small variations. Although the current flowing through resistor 46a includes a current I7 flowing from the load side to resistor 46a and a current I8 flowing out from resistor 46a to the load side as described by the broken lines in FIGS. 13 and 14, these current components are omitted from the above description. In FIGS. 13 and 14, Tr1 may comprise a p-channel MOSFET device.

The influences of the manufacturing variations and the temperature dependence on the output characteristics of the pressure sensor will be described below with reference again to FIG. 11. In FIG. 11, the reference for the pressure sensor output is represented by the solid line b. In other words, the saturation voltage ranges (which are the ranges, in which the voltage is constant and the constant voltage is the saturation voltage) are between the steady output range and the diagnostic ranges. The lower limit saturation voltage is located in the range (Δ1) between Va and Vb and the upper limit saturation voltage in the range (Δ2) between Vc and Vd.

A liner output voltage is obtained corresponding to the pressure in the steady output range. When an extremely high pressure (or an extremely low pressure) outside the steady output range is caused while the pressure sensor is conducting the steady operations (with no wiring breakage) not by a trouble but by any other factor, it is desirable for the pressure sensor to continue operating. For facilitating this, it is desirable for the output from signal amplifier circuit 10c to saturate before teaching the diagnostic ranges. In other words, it is desirable for the output from signal amplifier circuit 10c to saturate in the range between Va and Vb and in the range between Vc and Vd.

However, when the output voltage range of signal amplifier circuit 10c is widened (that is the output voltage hardly saturates) due to the adverse effects of the manufacturing variations and the temperature dependence, the output voltage as represented by the broken line a is obtained. Because the output voltage represented by the broken line a saturates in the diagnostic ranges, the saturation voltage may occur in any of the diagnostic ranges even when the pressure sensor is conducting the steady operations. In this case, the ECU will misdiagnose that the pressure sensor is in trouble.

Contrary to this, when the output voltage range of signal amplifier circuit 10c is narrowed (that is the output voltage saturates easily), the output voltage as represented by the broken line c is obtained. The output voltage may saturate in the region, in which the output voltage should depend linearly on the pressure (the region near to Vb or Vc). Therefore, the pressure sensor may fail to exhibit the designed functions.

One way of obviating the problems described above is to set the diagnostic ranges and the steady output range considering the ranges, for which the saturation voltages vary due to the manufacturing variations and the temperature dependence. In other words, it is effective to secure the range between Va and Vb and the range between Vc and Vd as widely as necessary to absorb the saturation voltage variations caused in the output characteristics.

However, the saturation voltage variation range of conventional signal amplifier circuit 10c is wide. FIG. 15 is a graph exemplary describing the temperature dependence and the manufacturing variation range of the lower limit saturation voltage in conventional signal amplifier circuit 10c. In FIG. 15, the X-axis represents the temperature (° C.), the Y-axis the lower limit saturation voltage (V), MAX the maximum values of the lower limit saturation voltages caused by the manufacturing variations, TYP the designed values of the lower limit saturation voltages, and MIN the minimum values of the lower limit saturation voltages caused by the manufacturing variations.

As FIG. 15 indicates, variations of around 70 mV are caused by the temperature dependence, variations of around 70 mV are caused by the manufacturing variations, and, therefore, the total variations of around 140 mV are caused in the lower limit saturation voltage of signal amplifier circuit 10c. In FIG. 15, the measurements are conducted at the power supply voltage of 5 V. Therefore, the total variations of 140 mV are caused for the power supply voltage of 5 V. In other words, the lower limit saturation voltage of conventional signal amplifier circuit 10c has a variation range equivalent to 2.8% of the entire output voltage range that is not necessarily narrow enough. Although not described in detail, similar variations are caused in the upper limit saturation voltage.

Patent Document 1: Unexamined Japanese Patent Application Publication 2003-304633.

For narrowing the output voltage variation range, it is necessary to reduce the manufacturing variations caused in the characteristics (the ON-voltage, impedance and such characteristics) of transistors Tr1 and Tr2 in operational amplifier 41 and resistance value of resistor 46a. Although the manufacturing variations may be reduced by selecting the characteristics of the pressure sensor or by innovating on the manufacturing method, the manufacturing costs will be increased. Since the temperature dependence relates to the temperature dependence specific to the relevant material, it is difficult to reduce the temperature dependence.

In view of the foregoing, it would be desirable to provide a signal amplifier circuit, substantially unaffected adversely by the manufacturing variations and the temperature dependence of each constituent element (the transistor or the resistor) and exhibiting small variations in the saturation voltages as the characteristic output thereof.

Further objects and advantages of the invention will be apparent from the following description of the invention.

SUMMARY OF THE INVENTION

According to the subject matter of the first aspect, there is provided a signal amplifier circuit including:

a negative feedback amplifier circuit including an output terminal;

a first voltage limiting means limiting the output voltage from the negative feedback amplifier circuit;

a second voltage limiting means limiting the output voltage from the negative feedback amplifier circuit;

a first reference voltage supply applying a first reference voltage to the first voltage limiting means; and a second reference voltage supply applying a second reference voltage to the second voltage limiting means;

wherein the first voltage limiting means discharges a source current to the output terminal of the negative feedback amplifier circuit when the output voltage from the negative feedback amplifier circuit exceeds the first reference voltage to the lower side to fix a lower limit saturation voltage at the first reference voltage; and the second voltage limiting means draws a sink current from the output terminal of the negative feedback amplifier circuit when the output voltage from the negative feedback amplifier circuit exceeds the second reference voltage to the higher side to fix an upper limit saturation voltage at the second reference voltage.

According to a second aspect, in the signal amplifier circuit described in the appended the first aspect, the first voltage limiting means includes a first operational amplifier and a first diode;

the output terminal of the negative feedback amplifier circuit is connected to the inverting input terminal of the first operational amplifier;

the first reference voltage supply is connected to the non-inverting input terminal of the first operational amplifier;

the anode terminal of the first diode is connected to the output terminal of the first operational amplifier;

the cathode terminal of the first diode is connected to the output terminal of the negative feedback amplifier circuit; the second voltage limiting means includes a second operational amplifier and a second diode;

the output terminal of the negative feedback amplifier circuit is connected to the inverting input terminal of the second operational amplifier;

the second reference voltage supply is connected to the non-inverting input terminal of the second operational amplifier;

the cathode terminal of the second diode is connected to the output terminal of the second operational amplifier; and the anode terminal of the second diode is connected to the output terminal of the negative feedback amplifier circuit.

According to a third aspect, in the signal amplifier circuit described in the first aspect, the first voltage limiting means includes a first operational amplifier and an NMOS transistor;

the output terminal of the negative feedback amplifier circuit is connected to the inverting input terminal of the first operational amplifier;

the first reference voltage supply is connected to the non-inverting input terminal of the first operational amplifier;

the gate terminal of the NMOS transistor is connected to the output terminal of the first operational amplifier;

the source terminal of the NMOS transistor is connected to the output terminal of the negative feedback amplifier circuit;

the back gate terminal of the NMOS transistor is connected to a ground terminal;

the drain terminal of the NMOS transistor is connected to a power supply terminal;

the second voltage limiting means includes a second operational amplifier and a PMOS transistor;

the output terminal of the negative feedback amplifier circuit is connected to the inverting input terminal of the second operational amplifier;

the second reference voltage supply is connected to the non-inverting input terminal of the second operational amplifier;

the gate terminal of the PMOS transistor is connected to the output terminal of the second operational amplifier;

the source terminal of the PMOS transistor is connected to the output terminal of the negative feedback amplifier circuit;

the drain terminal of the PMOS transistor is connected to the ground terminal; and the back gate terminal of the PMOS transistor is connected to the power supply terminal.

According to a fourth aspect, in the signal amplifier circuit described in the second aspect, the negative feedback amplifier circuit further includes a third operational amplifier, first through fifth resistors, a positive input terminal, a negative input terminal, and a third reference voltage supply;

the first resistor has a first end connected to the negative input terminal and a second end connected to the first end of the second resistor;

the third resistor has a first end connected to the positive input terminal and a second end connected to the first end of the fourth resistor;

the connection point of the first and second resistors is connected to the inverting input terminal of the third operational amplifier;

the connection point of the third and fourth resistors is connected to the non-inverting input terminal of the third operational amplifier;

the fifth resistor has a first end connected to the output from the third operational amplifier and a second end connected to the second end of the second resistor;

the connection point of the second and fifth resistors is connected to the output terminal of the negative feedback amplifier circuit; and the second end of the fourth resistor is connected to the third reference voltage supply.

According to a fifth aspect, in the signal amplifier circuit described in the forth aspect, the source current value of the first operational amplifier is equal to or more than the value obtained from ((the first reference voltage−the lower limit saturation voltage of the third operational amplifier)÷the resistance value of the fifth resistor); and the sink current value of the second operational amplifier is equal to or more than the value obtained from ((the upper limit saturation voltage of the third operational amplifier−the second reference voltage)÷the resistance value of the fifth resistor).

According to the subject matter of a sixth aspect, in the signal amplifier circuit described in the third aspect, the negative feedback amplifier circuit further includes a third operational amplifier, first through fifth resistors, a positive input terminal, a negative input terminal, and a third reference voltage supply;

the first resistor has a first end connected to the negative input terminal and a second end connected to the first end of the second resistor;

the third resistor has a first end connected to the positive input terminal and a second end connected to the first end of the fourth resistor;

the connection point of the first and second resistors is connected to the inverting input terminal of the third operational amplifier;

the connection point of the third and fourth resistors is connected to the non-inverting input terminal of the third operational amplifier;

the fifth resistor has a first end connected to the output from the third operational amplifier and a second end connected to the second end of the second resistor;

the connection point of the second and fifth resistors is connected to the output terminal of the negative feedback amplifier circuit; and the second end of the fourth resistor is connected to the third reference voltage supply.

According to a seventh aspect, in the signal amplifier circuit described in the sixth aspect, the source current value of the NMOS transistor is equal to or more than the value obtained from ((the first reference voltage−the lower limit saturation voltage of the third operational amplifier)÷the resistance value of the fifth resistor); and the sink current value of the PMOS transistor is equal to or more than the value obtained from ((the upper limit saturation voltage of the third operational amplifier−the second reference voltage)÷the resistance value of the fifth resistor).

According to the subject matter of an eighth aspect, in the signal amplifier circuit described in any of the first aspect through the seventh aspect, the first reference voltage supply or the second reference voltage supply includes a voltage selecting means that selects one voltage out of two or more voltages generated by voltage dividing resistors.

According to the subject matter of a ninth aspect, in the signal amplifier circuit described in the eighth aspect, the voltage selecting means includes a multiplexer.

According to the subject matter of a tenth aspect, in the signal amplifier circuit described in the eighth aspect, the voltage selecting means selects a photomask to form a metal wiring connected to predetermined voltage dividing resistors and to select a predetermined reference voltage.

According to the subject matter of an eleventh aspect, in the signal amplifier circuit described in the eighth aspect, the voltage selecting means cuts the metal wirings connected to the unnecessary voltage dividing resistors using the heat generated by a laser beam or by a current to leave the metal wiring connected to the predetermined resistors and to select a predetermined reference voltage.

Since the adverse effects of the manufacturing variations and the temperature dependence are eliminated according to the invention, the saturation voltages of the signal amplifier are set at the predetermined values (reference values) determined by the lower and upper voltage limiting means. Therefore, the signal amplifier circuit according to the invention facilitates reducing the variations of the saturation voltages as output characteristics.

DETAILED DESCRIPTION OF THE EMBODIMENTS

Figure 1:
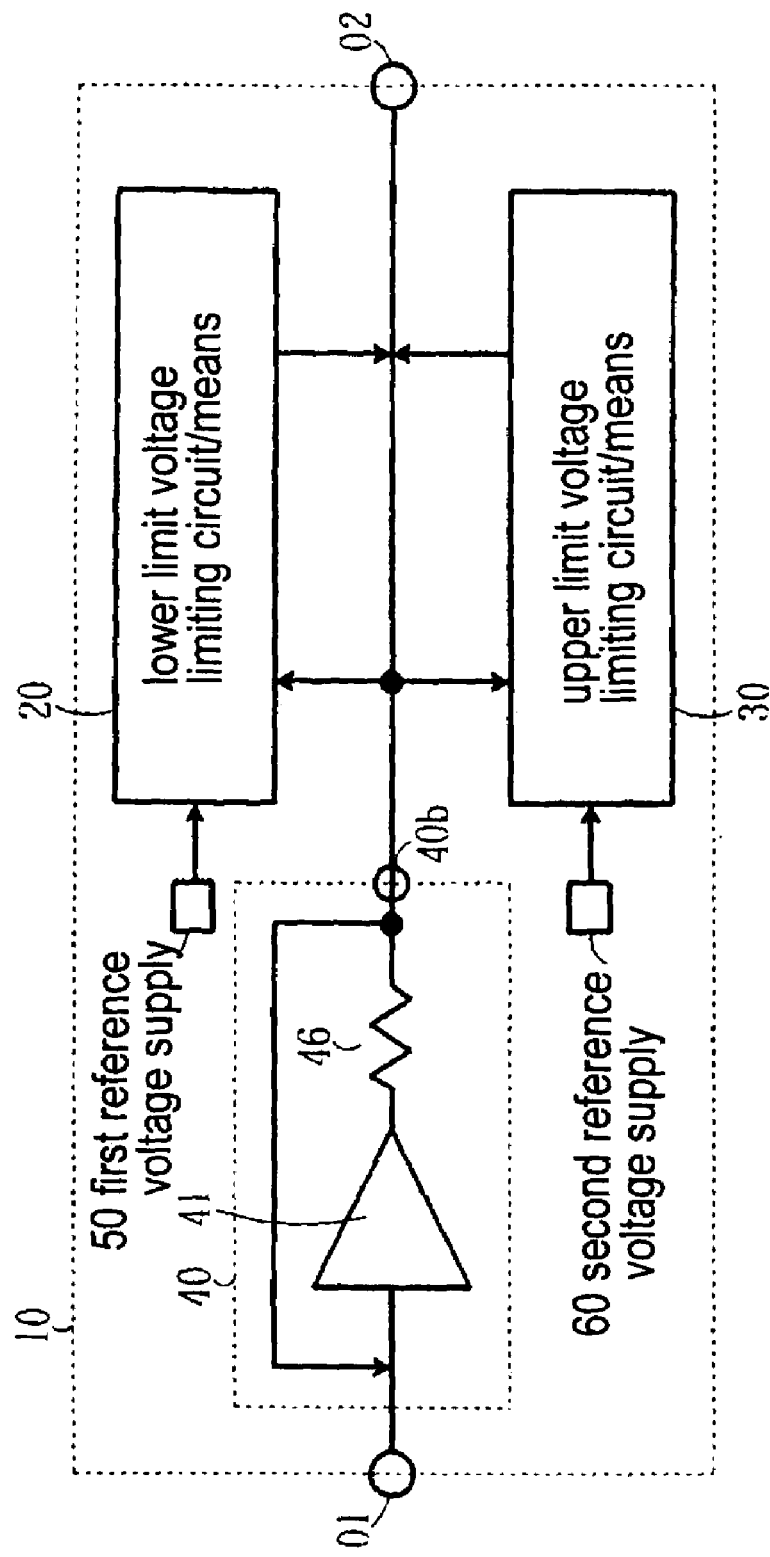
FIG. 1 is a block diagram illustrating the principle of the signal amplifier circuit according to the invention.

First, the principle of the signal amplifier circuit according to the invention will be described with reference to FIG. 1. FIG. 1 is a block diagram describing the principle of the signal amplifier circuit according to the invention. In FIG. 1, signal amplifier circuit 10 includes a differential amplifier circuit comprised of operational amplifier 41, negative feedback amplifier circuit 40 including resistor 46, lower limit voltage limiting circuit (lower limit voltage limiting means) 20, and upper limit voltage limiting circuit (upper limit voltage limiting means) 30.

The signal inputted from input terminal 01 is outputted in the form of a linear output voltage from output terminal 40*b* via negative feedback amplifier circuit 40. The lower limit saturation value of the output voltage is fixed at the value same with a first reference voltage (Vref1) inputted from first reference voltage supply 50 by lower limit voltage limiting circuit 20 and the upper limit saturation value of the output voltage is fixed at the value same with a second reference voltage (Vref2) inputted from second reference voltage supply 60 by upper limit voltage limiting circuit 30.

As the output voltage from negative feedback amplifier circuit 40 decreases such that the output voltage from negative feedback amplifier circuit 40 exceeds the first reference voltage Vref1 to the lower side, a certain source current is discharged to output terminal 40b of negative feedback amplifier circuit 40 from lower limit voltage limiting circuit 20 to make the output voltage Vout from Vout terminal 02 saturate (that is, to fix the output voltage Vout from Vout terminal 02) at the first reference voltage Vref1.

As the output voltage from negative feedback amplifier circuit 40 increases such that the output voltage from negative feedback amplifier circuit 40 exceeds the second reference voltage Vref2 to the higher side, upper limit voltage limiting circuit 30 draws a certain sink current from output terminal 40b of negative feedback amplifier circuit 40 to make the output voltage Vout from Vout terminal 02 saturate (that is to fix output voltage Vout from Vout terminal 02) at the second reference voltage Vref2.

By discharging a certain source current to output terminal 40b of negative feedback amplifier circuit 40, or by drawing a certain sink current from output terminal 40b of negative feedback amplifier circuit 40, the output voltage is made to saturate at the first reference voltage or at the second reference voltage. Because the saturation voltage is determined by the first reference voltage or by the second reference voltage, the influences of the characteristics variations of the transistors constituting the output stage of negative feedback amplifier circuit 40 and the influences of the resistance variations of the resistor are eliminated and the variations caused in the lower and upper limit saturation voltages, which are the output characteristics, are reduced.

The invention will now be described in detail in connection with the embodiments thereof.

First Embodiment

Figure 2:
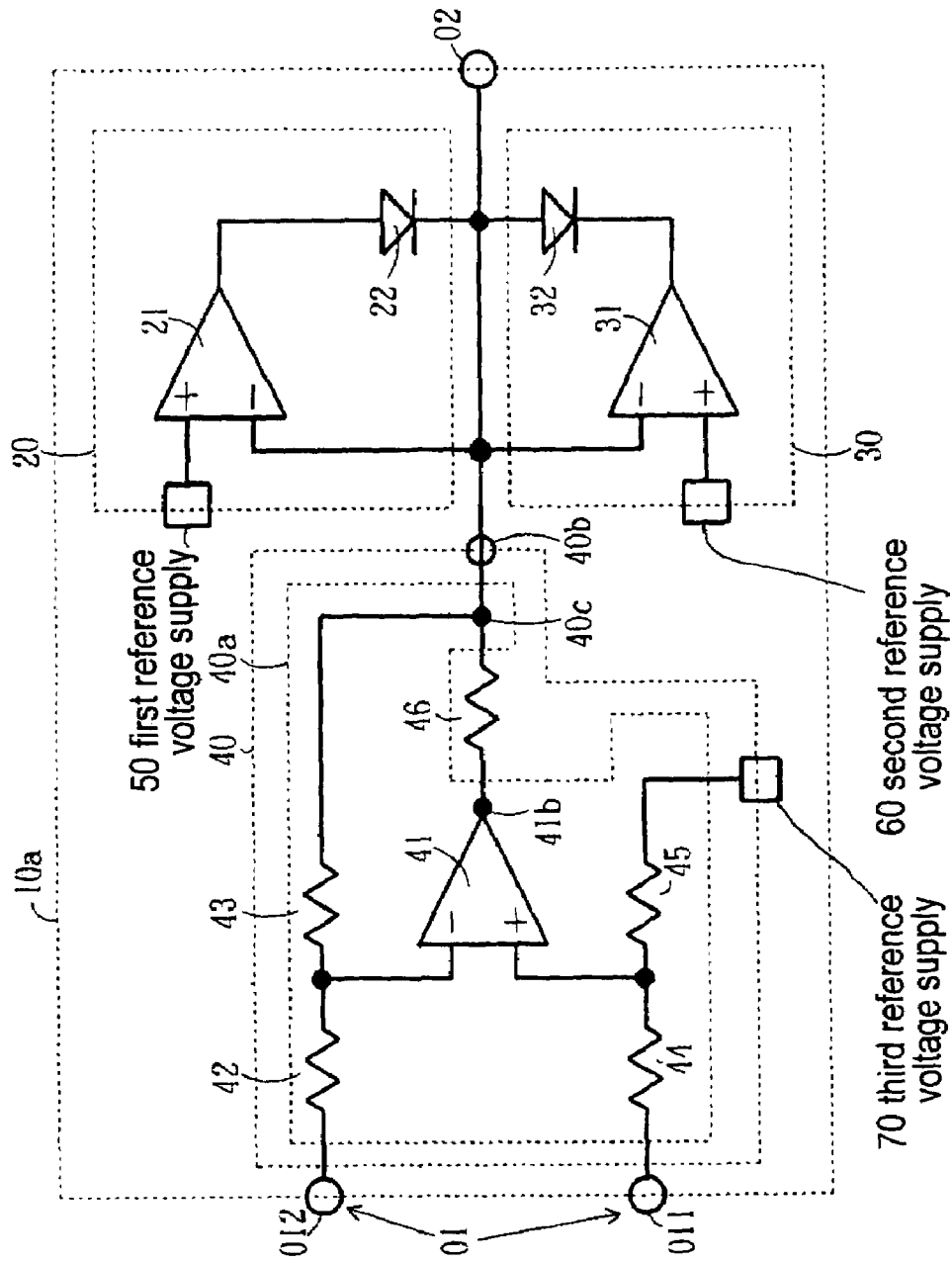
FIG. 2 is a block diagram of a signal amplifier circuit according to a first embodiment of the invention.

FIG. 2 is a block diagram of a signal amplifier circuit 10a according to the first embodiment of the invention and includes negative feedback amplifier circuit 40, lower limit voltage limiting circuit 20, and upper limit voltage limiting circuit 30. Negative feedback amplifier circuit 40 includes differential amplifier circuit 40a and resistor 46. Differential amplifier circuit 40a includes Vin+terminal 011, Vin−terminal 012, first through third reference voltage supplies 50, 60, and 70, and four resistors 42 through 45. Lower limit voltage limiting circuit 20 includes operational amplifier 21 and diode 22 for preventing a reverse current from flowing. Upper limit voltage limiting circuit 20 includes operational amplifier 31 and diode 32 for preventing a reverse current from flowing. The output terminal (Vout terminal 02) of signal amplifier circuit 10a is connected to output terminal 40b of negative feedback amplifier circuit 40. Output terminal 40b is connected to connection point 40c of resistors 43 and 46. Output terminal 41b of operational amplifier 41 is connected to the first end of resistor 46 and the second end of resistor 46 is connected to connection point 40c.

Figure 12:
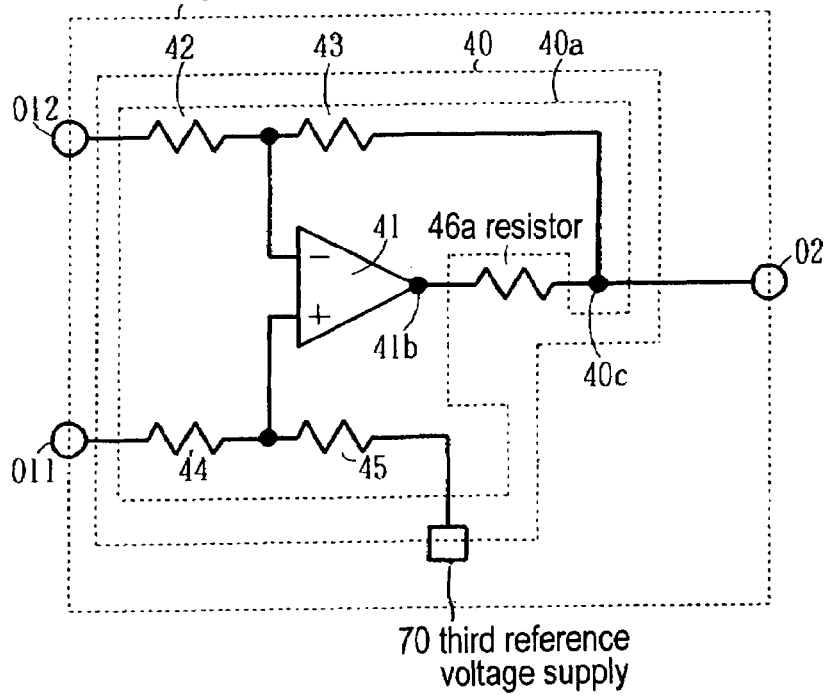
FIG. 12 is a block diagram of a signal amplifier circuit used as a general signal processing circuit for a pressure sensor.

The signal amplifier circuit shown in FIG. 2 is different from the signal amplifier circuit shown in FIG. 12 in that lower limit voltage limiting circuit 20 and upper limit voltage limiting circuit 30 are added in FIG. 2 to negative feedback amplifier circuit 40 shown in FIG. 12 and the resistance value of resistor 46 in FIG. 2 is about one tenth as high as the resistance value of resistor 46a in FIG. 12.

The value of resistor 46 (that is about one tenth as high as the resistance value of resistor 46a) is the one that meets the conditions described later in the formulas (1) and (2) and not always limited to the value about one tenth as high as the resistance value of resistor 46a. The factor of one tenth will change depending on the saturation voltage values as the references and the performances of negative feedback amplifier circuit 40, lower limit voltage limiting circuit 20, and upper limit voltage limiting circuit 30.

As for lower limit voltage limiting circuit 20, the non-inverting input terminal (+terminal) of operational amplifier 21 is connected to first reference voltage supply 50 and Vout terminal 02 is connected to the inverting input terminal (−terminal) of operational amplifier 21. The anode terminal of diode 22 is connected to the output terminal of operational amplifier 21 and the cathode terminal of diode 22 is connected to Vout terminal 02.

As for upper limit voltage limiting circuit 30, the non-inverting input terminal (+terminal) of operational amplifier 31 is connected to second reference voltage supply 60 and Vout terminal 02 is connected to the inverting input terminal (−terminal) of operational amplifier 31. The cathode terminal of diode 32 is connected to the output terminal of operational amplifier 31 and the anode terminal of diode 32 is connected to Vout terminal 02.

Figure 3:
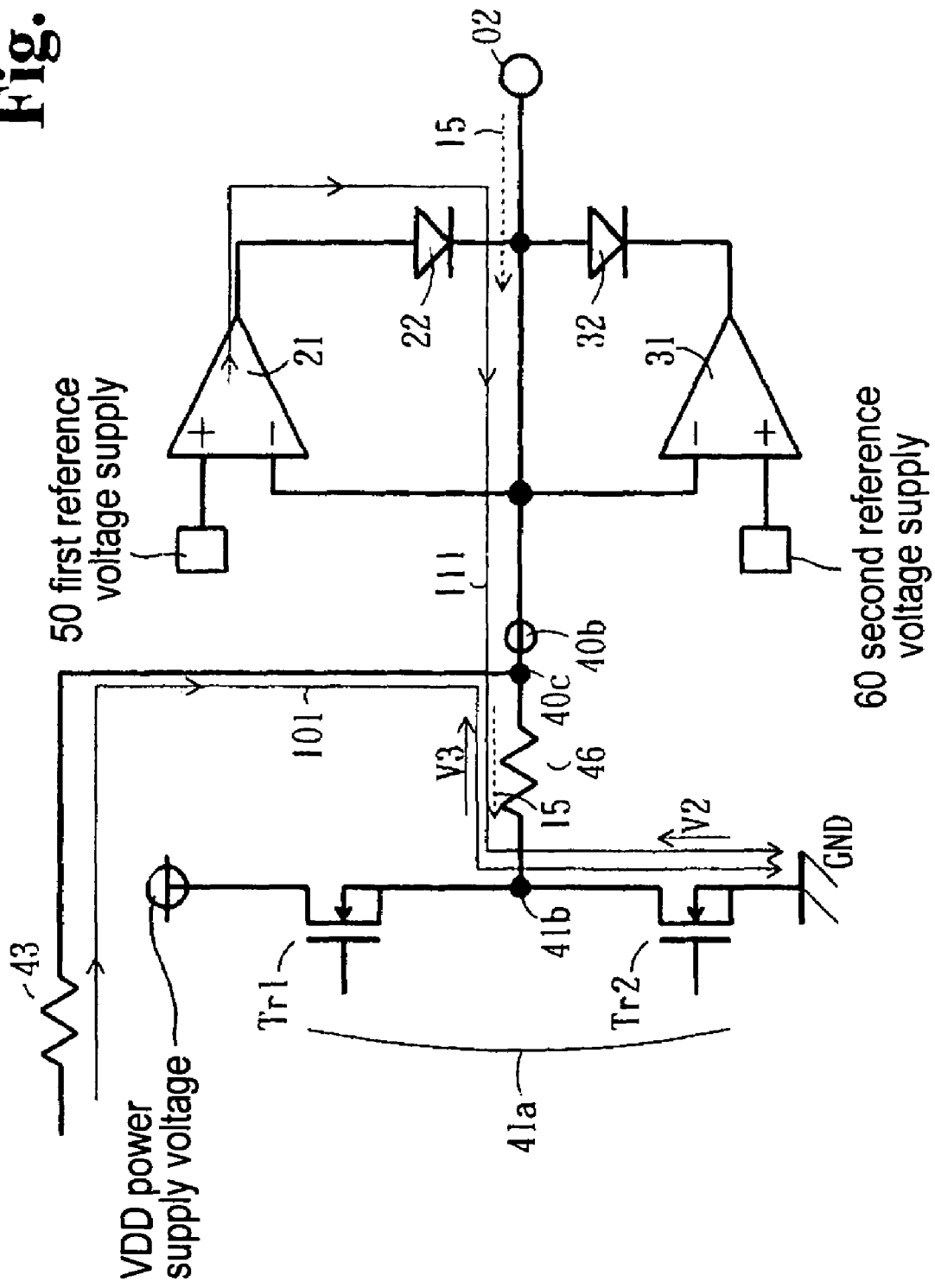
FIG. 3 is a diagram illustrating the lower limit saturation voltage in the circuit shown in FIG. 2.
Figure 4:
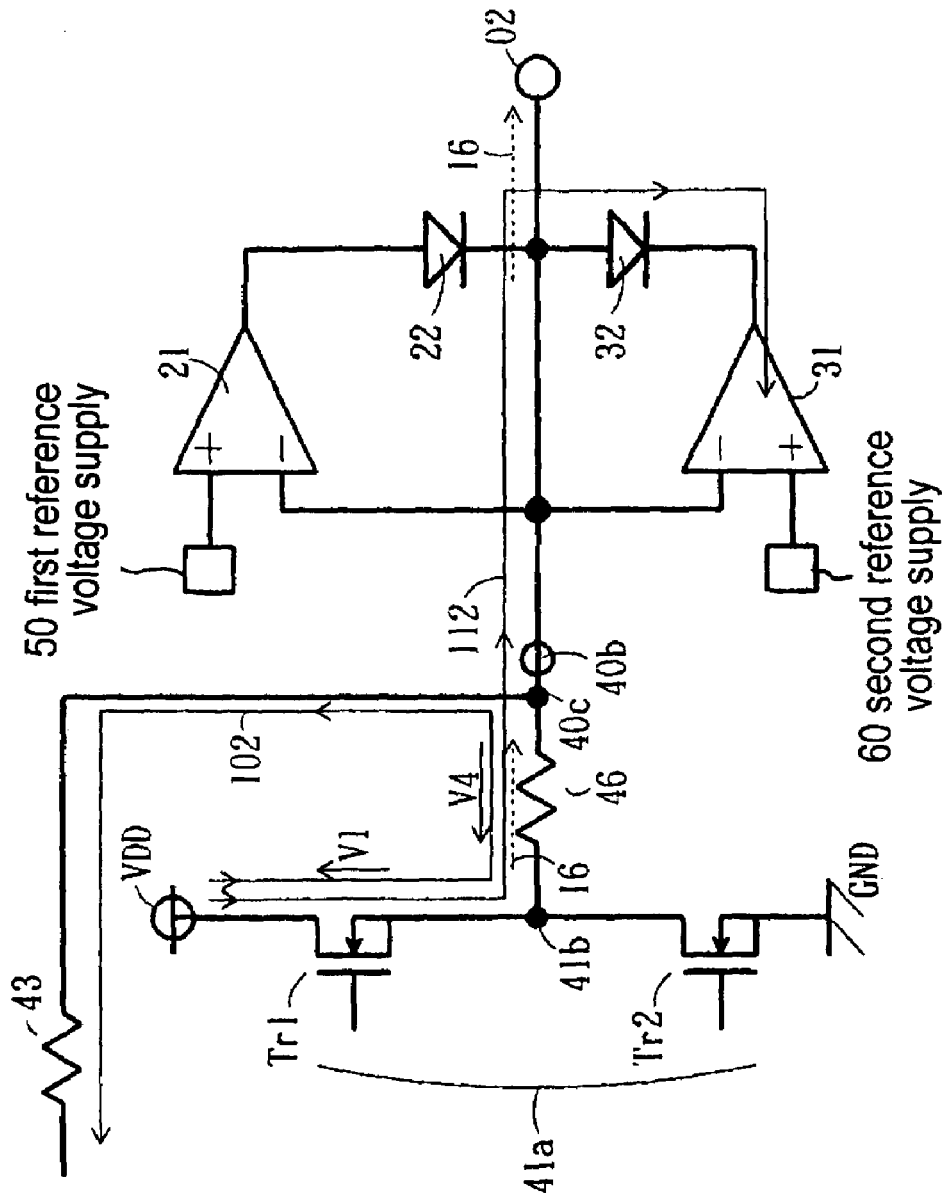
FIG. 4 is a diagram illustrating the upper limit saturation voltage in the circuit shown in FIG. 2.
Figure 13:
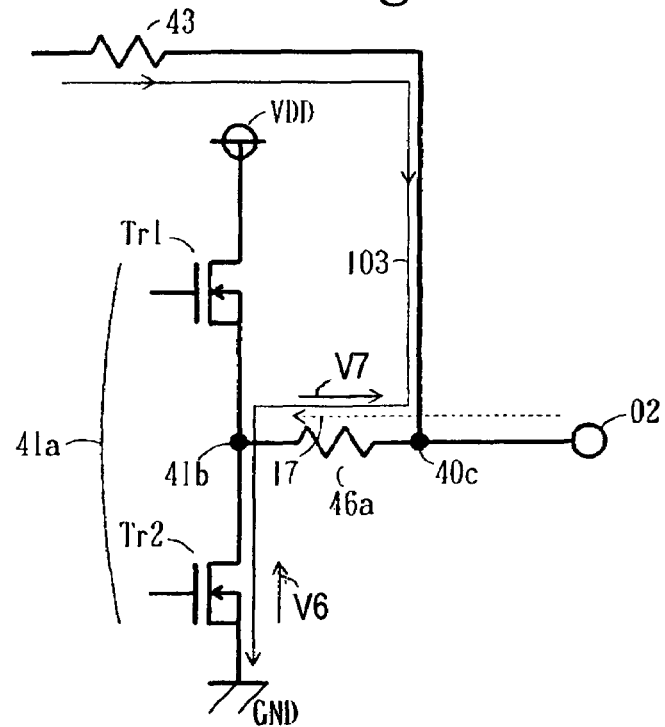
FIG. 13 is a diagram describing the lower limit saturation voltage.
Figure 14:
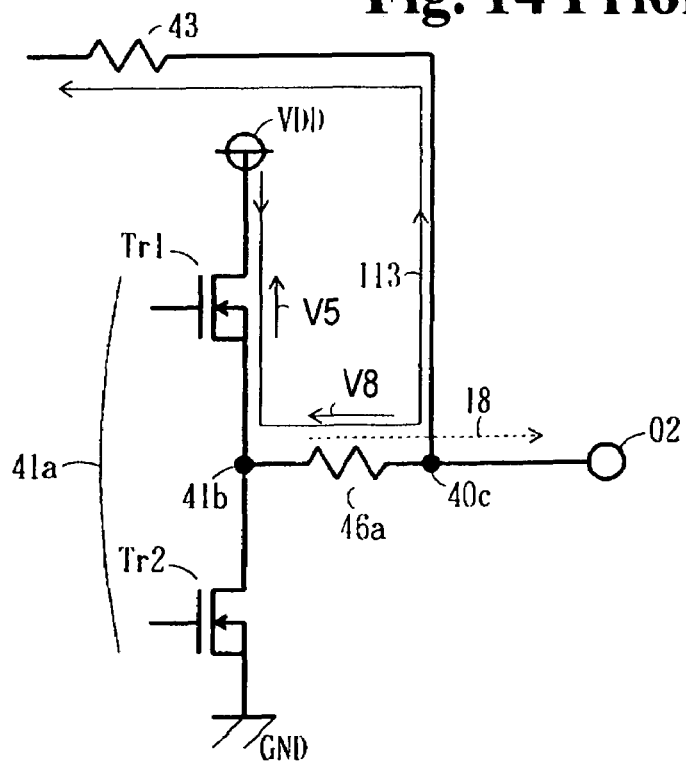
FIG. 14 is a diagram describing the upper limit saturation voltage.
Figure 15:
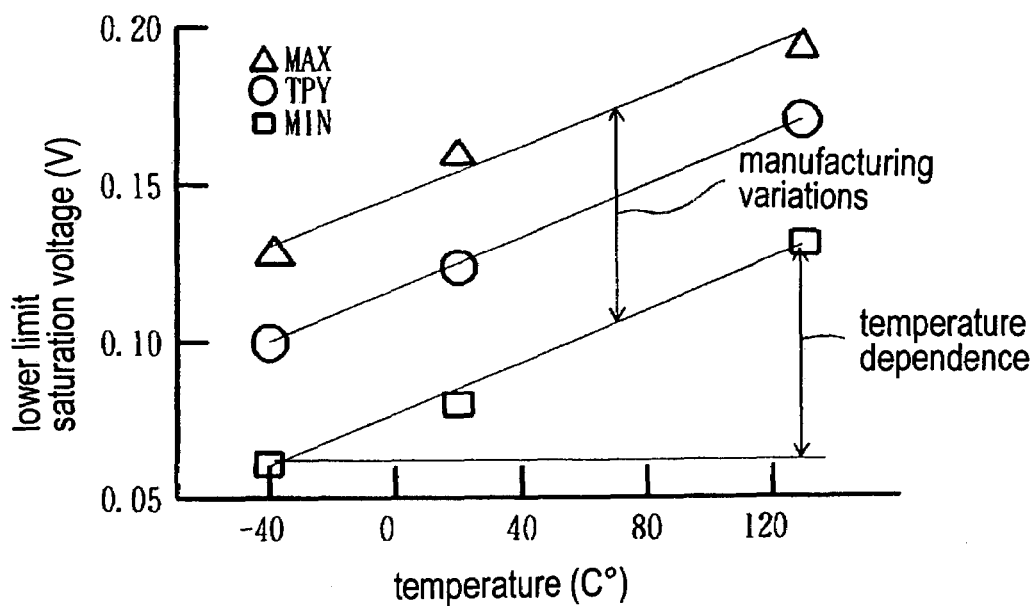
FIG. 15 is a graph exemplary describing the temperature dependence and the manufacturing variation range of the lower limit saturation voltage in the conventional signal amplifier circuit.

Now the operations of the circuit shown in FIG. 2 will be described below with reference to FIGS. 3 and 4. For the sake of explanatory conveniences, the circuit constants are set as described below. The voltage Vref1 of first reference voltage supply 50 is fixed at 0.1 V, the voltage Vref2 of second reference voltage supply 60 at 4.9 V, the resistance of resistor 46 at 10Ω (the resistance of resistor 46a in FIG. 12 is around 100Ω), the lower limit saturation voltage of operational amplifiers 21, 31, and 41 at 0.05 V, and the upper limit saturation voltage of operational amplifiers 21, 31, and 41 at 4.95 V. In FIGS. 3 and 4, Tr1 and Tr2 designate the transistors (MOSFETs) at the output stage of operational amplifier 41. Although a current I5 flows in from the load side and a current I6 flows out to the load sides as indicated by the broken lines in FIGS. 3 and 4, the descriptions thereof will be omitted from the following descriptions. The values of the currents I5 and I6 are about one tenth as large as the source current I11 and the sink current I12. As described with reference to FIGS. 13 and 14, transistor Tr1 in FIGS. 3 and 4 may comprise a p-channel MOSFET.

First, the operations of lower limit voltage limiting circuit 20 will be described with reference to FIG. 3. As the output voltage Vout from Vout terminal 02 is higher than 0.1 V, the relation Vref1<Vout holds (the voltage at the −terminal of operational amplifier 21 is larger than the voltage at the +terminal thereof), since the voltage Vref1 of first reference voltage supply 50 for operational amplifier 21 is 0.1 V. Because the output voltage of operational amplifier 21 is 0.05 V (the lower limit saturation state), the output voltage Vout is larger than the output voltage of operational amplifier 21. Because the output voltage Vout is at the cathode voltage of diode 22 and the output voltage of operational amplifier 21 is at the anode voltage of diode 22, diode 22 is biased in reverse, making no current flow through diode 22. In other words, when the output voltage Vout is higher than 0.1 V, operational amplifier 21 and diode 22 do not affect the potential of Vout terminal 02.

When the output voltage Vout is lower than 0.1 V, the output voltage Vout from Vout terminal 02 is smaller than the reference voltage Vref1. Therefore, the output voltage from operational amplifier 21 starts rising. As the output voltage from operational amplifier 21 that keeps rising exceeds the sum of the output voltage Vout and the threshold value Vf of diode 22 (thereat the forward current starts flowing) to the higher side, diode 22 shifts to the electrically conductive state thereof and the source current I11 of operational amplifier 21 starts flowing from operational amplifier 21 to operational amplifier 41 (transistor Tr2) via diode 22 and resistor 46.

As the source current I11 flows, the current (I11+I01), which is the sum of the source current I11 and the sink current I01 flowing from connection point 40c into resistor 46 via resistor 43, flows through resistor 46 and transistor Tr2, causing a voltage drop V3 (=R46×(I11+I01)) across resistor 46 and the voltage V2 (the ON-voltage and the voltage caused by the impedance) of transistor Tr2. The output voltage Vout from Vout terminal 02 is made to start and keep rising by these voltages (V2+V3) until the output voltage Vout finally reaches Vref1 (the voltage of first reference voltage supply 50). In other words, lower limit voltage limiting circuit 20 makes the output voltage Vout from Vout terminal 02 not to be lower than the first reference voltage Vref1. The lower limit saturation voltage is fixed at Vref1 (=0.1V) by these operations.

The numerical values described above are exemplary and non-limiting. The effects of the invention may be obtained by employing other numerical values.

In detail, if the circuit constants are set such that the following relational expression (1) holds, the lower limit saturation voltage may be set to be higher than the upper limit voltage Va of the diagnostic range on the low voltage side.

$$I11 \geq (Vref1 - Va) \div R46 \tag{1}$$

Figure 11:
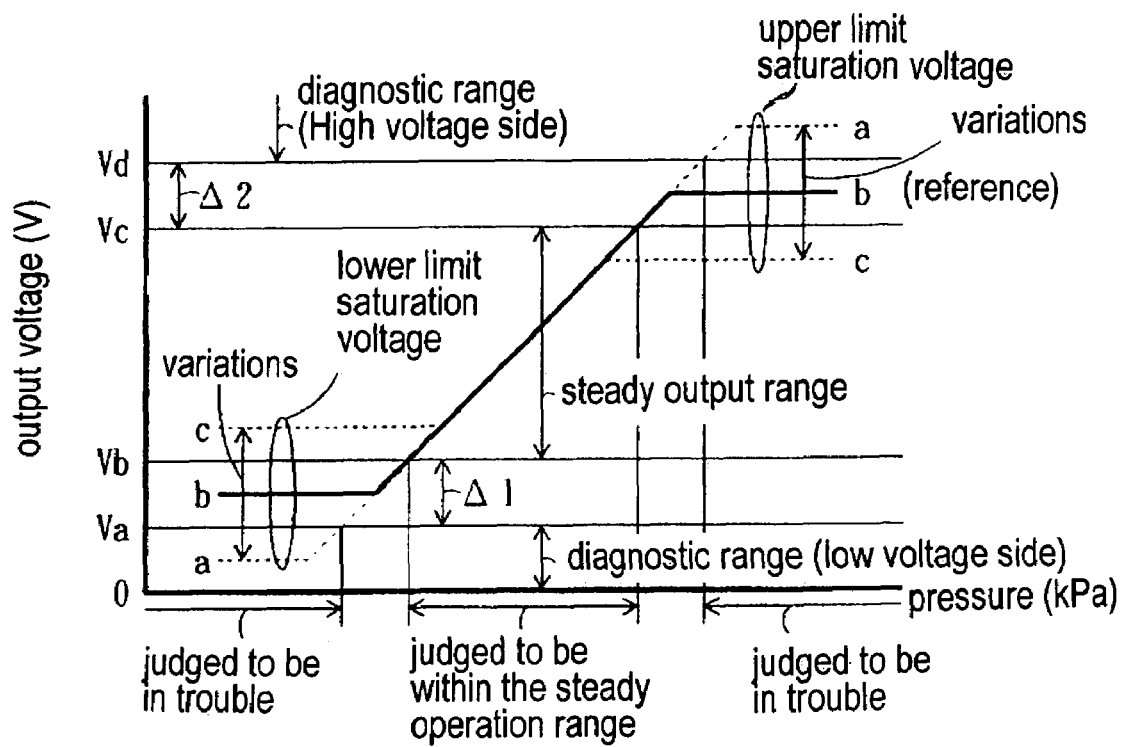
FIG. 11 is a diagram conceptually describing the relationship between the output characteristics of the pressure sensor and the diagnostic function thereof.

Here, Va is the lower limit saturation voltage of operational amplifier 41 (the upper limit voltage Va of the diagnostic range on the low voltage side shown in FIG. 11) and R46 is the resistance value of resistor 46.

Then, the operations of upper limit voltage limiting circuit 30 shown in FIG. 2 will be described with reference to FIG. 4. The fundamental operations of upper limit voltage limiting circuit 30, which are almost the same with the operations of the above described lower limit voltage limiting circuit 20, will be described briefly.

As far as the output voltage Vout from Vout terminal 02 is lower than Vref2 (the voltage of second reference voltage supply 60), operational amplifier 31 and diode 32 are biased in reverse, exerting no influence on the output voltage Vout from Vout terminal 02.

If the output voltage Vout is going to exceed Vref2 to the higher side, diode 32 is biased in forward and operational amplifier 31 starts drawing a current via diode 32. As a result, upper limit voltage limiting circuit 30 limits the output voltage Vout to be lower than Vref2.

When the output voltage Vout is more than 4.9V, the output voltage Vout from Vout terminal 02 is more than the reference voltage Vref2. Therefore, the output voltage from operational amplifier 31 starts falling. As the output voltage from operational amplifier 31 that keeps falling falls below the difference of the output voltage Vout and the threshold value Vf of diode 32 (thereat the forward current starts flowing), diode 32 shifts to the electrically conductive state thereof and the sink current I12 of operational amplifier 31 starts flowing from operational amplifier 41 (transistor Tr1) to operational amplifier 31 via resister 46 and diode 32.

As the sink current I12 flows, the current (I12+I02), which is the sum of the sink current I12 and the source current I02 flowing from connection point 41b into resistor 46 via resistor 43, flows through resistor 46 and transistor Tr1, causing a voltage drop V4 (=R46×(I12+I02)) across resistor 46 and the voltage V1 (the ON-voltage and the voltage caused by impedance) of transistor Tr1. The output voltage Vout from Vout terminal 02 is made to start and keep falling by these voltages (V1+V4) until the output voltage Vout finally reaches Vref2 (the voltage of second reference voltage supply 60). In other words, upper limit voltage limiting circuit 30 makes the output voltage Vout from Vout terminal 02 not to be more than the second reference voltage Vref2. The upper limit saturation voltage is fixed at Vref2 (=4.9V) by these operations.

The numerical values described above are exemplary and the effects of the invention may be obtained also by employing the other numerical values.

If the circuit constants are set such that the following relational expression (2) holds, the upper limit saturation voltage may be set to be lower than the lower limit voltage Vd of the diagnostic range on the high voltage side.

$$I12 \geq (Vd - Vref2) \div R46 \tag{2}$$

Here, Vd is the upper limit saturation voltage of operational amplifier 41 (the lower limit voltage Vd of the diagnostic range on the high voltage side shown in FIG. 11) and R46 is the resistance value of resistor 46.

The circuit configurations and circuit operations described above facilitate setting the upper and lower limit saturation voltages for the output voltage from signal amplifier circuit 10a not to be within the respective diagnostic ranges.

In addition, the most specific feature of the circuit according to the invention is its supreme performances of suppressing the adverse effects of the manufacturing variations and the temperature dependence.

The most specific feature of the circuit according to the invention is obtained, since the current flowing through resistor 46 is controlled by lower limit voltage limiting circuit 20 or by upper limit voltage limiting circuit 30 depending on the manufacturing variations and the temperature dependence.

For example, when the value of resistor 46 is larger than the designed one due to the manufacturing variations, the source current I11 of lower limit voltage limiting circuit 20 or the sink current I12 of upper limit voltage limiting circuit 30 is adjusted automatically to be smaller. When the value of resistor 46 is smaller than the designed one due to the manufacturing variations, the source current I11 of lower limit voltage limiting circuit 20 or the sink current I12 of upper limit voltage limiting circuit 30 is adjusted automatically to be larger.

As a result, the voltage drop across resistor 46 is adjusted by the manufacturing variations or by the temperature dependence. By using the circuit operations described above, the saturation voltage is made to be always close to the first reference voltage Vref1 or the second reference voltage Vref2 irrespective of the manufacturing variations and the temperature dependence.

Although the saturation voltage control has been exemplary described so far in connection with the manufacturing variations caused in resistor 46, the variations caused in the characteristics of transistors Tr1 and Tr2 in operational amplifier 41 may be compensated by employing the voltage drop across resistor 46.

Figure 5:
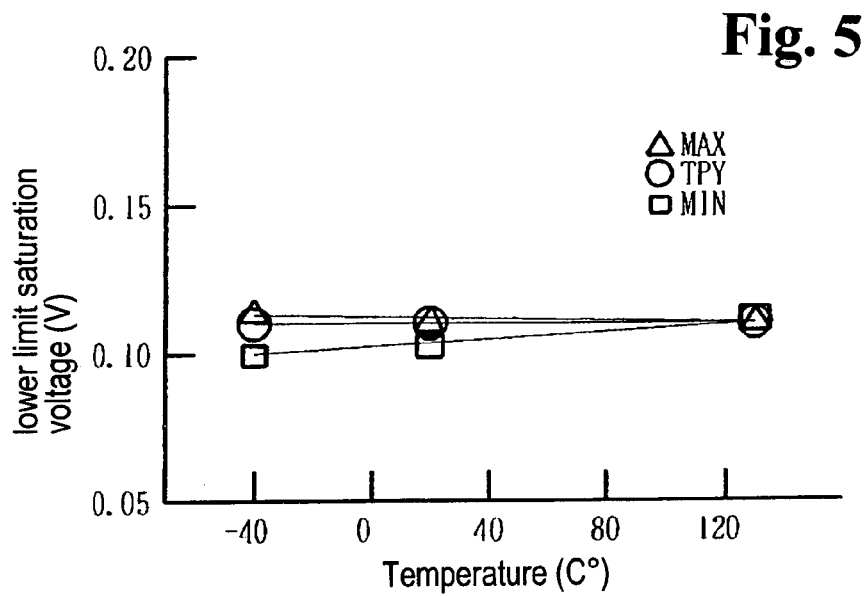
FIG. 5 shows a set of curves illustrating the temperature dependence of the lower limit saturation voltage including the manufacturing variations obtained in the signal amplifier circuit shown in FIG. 2.

FIG. 5 shows a set of curves describing the temperature dependence of the lower limit saturation voltage including the manufacturing variations obtained in signal amplifier circuit 10a shown in FIG. 2. In FIG. 5, the X-axis represents the temperature (° C.) and the Y-axis the lower limit saturation voltage (V). In FIG. 5, MAX designates the largest lower limit saturation voltage values caused by the manufacturing variations, TYP the lower limit saturation voltage values as designed, and MIN the smallest lower limit saturation voltage values caused by the manufacturing variations. The power supply voltages and the manufacturing conditions are the same with those of the conventional signal amplifier circuit.

As described in FIG. 5, the variations caused in the lower limit saturation voltage, which is the output characteristics of the signal amplifier circuit, are reduced greatly and the temperature variations thereof are also reduced to the extent that confines the saturation voltage variations including the temperature dependence thereof within the extremely small range of 20 mV or smaller.

As a result, signal amplifier circuit 10c according to the first embodiment facilitates eliminating the adverse effects of the temperature dependence and the manufacturing variations of the constituent elements and minimizing the variations of the output characteristics such as the lower limit saturation voltage and the upper limit saturation voltage. Since signal amplifier circuit 10a according to the first embodiment makes the lower and upper limit saturation voltages not to enter the respective diagnostic ranges when the pressure sensor is operating normally, signal amplifier circuit 10a facilitates making the pressure sensor conduct normal operations securely without causing any malfunction.

Second Embodiment

Figure 6:
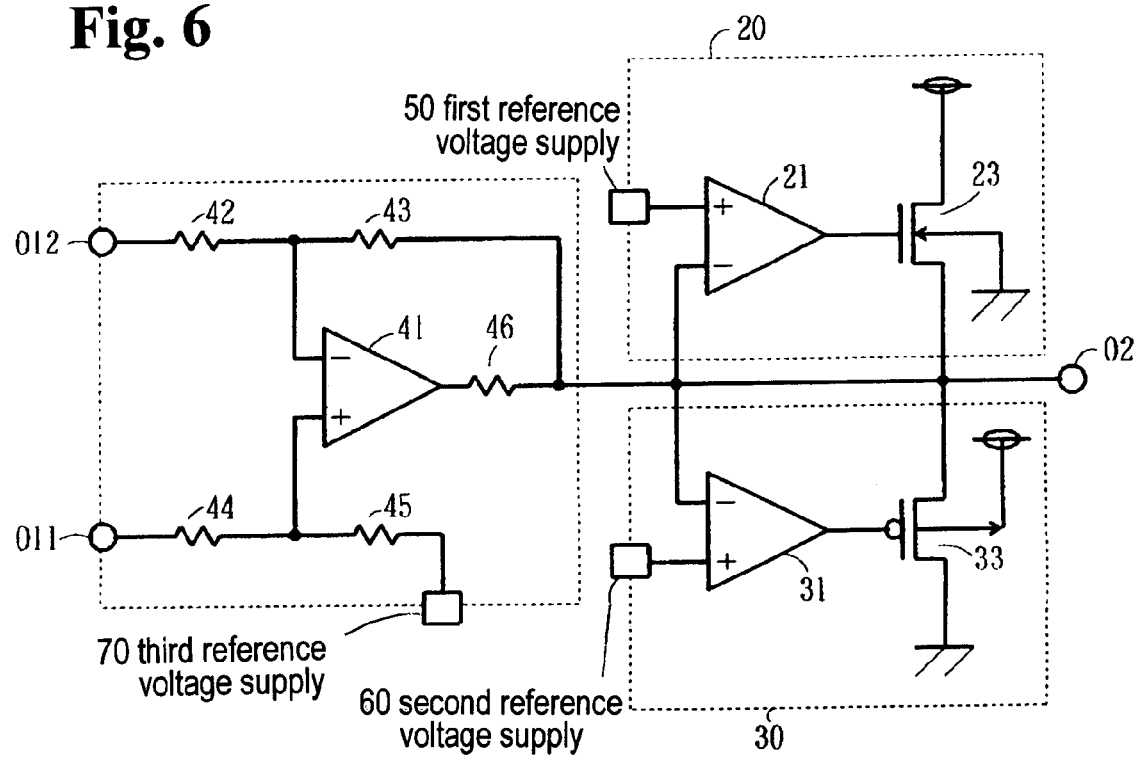
FIG. 6 is a block diagram of a signal amplifier circuit according to a second embodiment of the invention.

FIG. 6 is a block diagram of a signal amplifier circuit according to the second embodiment of the invention. The signal amplifier circuit according to the second embodiment is different from the signal amplifier circuit according to the first embodiment (shown in FIG. 2) in that the devices constituting lower and upper limit voltage limiting circuits 20 and 30 are operational amplifiers and MOS transistors in FIG. 6 while the devices constituting lower and upper limit voltage limiting circuits 20 and 30 are operational amplifiers and diodes in FIG. 2.

Referring now to FIG. 6, as for lower limit voltage limiting circuit 20, the non-inverting input terminal (+terminal) of operational amplifier 21 is connected to first reference voltage supply 50 and the inverting input terminal (−terminal) of operational amplifier 21 to Vout terminal 02. The gate terminal of NMOS transistor 23 is connected to the output terminal of operational amplifier 21, the drain terminal of NMOS transistor 23 to Vout terminal 02, the source terminal of NMOS transistor 23 to a power supply terminal (hereinafter referred to as a "VDD terminal"), and the back gate terminal (hereinafter referred to sometimes as the "SUB terminal") of NMOS transistor 23 to a ground terminal (hereinafter referred to as a "GND terminal").

As for upper limit voltage limiting circuit 30, the non-inverting input terminal (+terminal) of operational amplifier 31 is connected to second reference voltage supply 60 and the inverting input terminal (−terminal) of operational amplifier 31 to Vout terminal 02. The gate terminal of PMOS transistor 33 is connected to the output terminal of operational amplifier 31, the source terminal of PMOS transistor 33 to Vout terminal 02, the drain terminal of PMOS transistor 33 to the GND terminal, and the SUB terminal of PMOS transistor 33 to the VDD terminal.

The SUB terminal is a terminal connected to the channel formation region (back gate) of a MOS transistor. The channel formation region in NMOS transistor 23 is a p-type well or a p-type substrate. Similarly, the channel formation region in PMOS transistor 33 is an n-type well or an n-type substrate.

Now the operations of the signal amplifier circuit shown in FIG. 6 will be described below.

For the sake of explanatory conveniences and in the same manner as for the signal amplifier circuit according to the first embodiment, the circuit constants are set as described below. The voltage Vref1 of first reference voltage supply 50 is fixed at 0.1 V, the voltage Vref2 of second reference voltage supply 60 at 4.9 V, the resistance of resistor 46 at 10Ω (the resistance of resistor 46a in FIG. 12 is around 100Ω), the lower limit saturation voltage of operational amplifiers 21, 31, and 41 at 0.05 V, and the upper limit saturation voltage of operational amplifiers 21, 31, and 41 at 4.95 V.

First, as the output voltage Vout from Vout terminal 02 is higher than 0.1 V, the relation Vref1<Vout holds (the voltage at the −terminal of operational amplifier 21 is larger than the voltage at the +terminal thereof), since the voltage Vref1 of first reference voltage supply 50 for operational amplifier 21 is 0.1 V. Since the output voltage of operational amplifier 21 is 0.05 V (the lower limit saturation state), the output voltage Vout is larger than the output voltage of operational amplifier 21. Since the voltage obtained by subtracting the source voltage of NMOS transistor 23 from the gate voltage of NMOS transistor 23 is negative, NMOS transistor 23 is in the OFF-state thereof. Since any current does not flow from the VDD terminal to Vout terminal 02 via NMOS transistor 23, the potential of Vout terminal 02 is unaffected.

When the output voltage Vout is lower than 0.1 V, the output voltage Vout from Vout terminal 02 is smaller than the reference voltage Vref1. Therefore, the output voltage from operational amplifier 21 starts rising. As the output voltage from operational amplifier 21 that keeps rising exceeds the sum of the output voltage Vout and the threshold value Vth of NMOS transistor 23 to the higher side, NMOS transistor 23 shifts to the ON-state thereof and a source current starts flowing from the VDD terminal to Vout terminal 02 via NMOS transistor 23. The source current flowing through resistor 46 causes a voltage drop across resistor 46. Although not described in detail, the adjusting operation that finally equalizes the output voltage Vout to Vref1 (the voltage of first reference voltage supply 50) is conducted in the same manner as by the signal amplifier circuit according to the first embodiment.

If the circuit constants are set such that the following relational expression holds, the lower limit saturation voltage may be set to be higher than the upper limit voltage Va of the diagnostic range on the low voltage side.

The source current$\geq$(Vref1−Va)÷R46

Here, Va is the lower limit saturation voltage of operational amplifier 41 (the upper limit voltage Va of the diagnostic range on the low voltage side shown in FIG. 11) and R46 is the resistance value of resistor 46.

Then, the operations of upper limit voltage limiting circuit 30 shown in FIG. 6 will be described. The fundamental operations of upper limit voltage limiting circuit 30, which are almost the same with the above described operations of the lower limit voltage limiting circuit 20, will be described briefly.

As long as the output voltage Vout from Vout terminal 02 is lower than Vref2 (the voltage of second reference voltage supply 60), the output voltage from operational amplifier 31 is in the upper limit saturation state and the voltage difference obtained by subtracting the source voltage of PMOS transistor 33 from the gate voltage thereof is positive. Since PMOS transistor 33 is in the OFF-state thereof, the output voltage Vout from Vout terminal 02 is unaffected.

If the output voltage Vout exceeds Vref2 on the high side, the voltage difference obtained by subtracting the source voltage of PMOS transistor 33 from the gate voltage thereof turns to be negative and PMOS transistor 33 shifts to the ON-state thereof. Therefore, a sink current starts flowing from Vout terminal 02 through PMOS transistor 33. As a result, upper limit voltage limiting circuit 30 limits the output voltage Vout to be lower than Vref2.

If the circuit constants are set such that the following relational expression holds, the upper limit saturation voltage may be set to be lower than the lower limit voltage Vd of the diagnostic range on the high voltage side.

The sink current $\geq (Vd - Vref2) \div R46$

Here, Vd is the upper limit voltage of operational amplifier 41 (the lower limit voltage of the diagnostic range on the high voltage side shown in FIG. 11) and R46 is the resistance value of resistor 46.

The circuit configurations and circuit operations described above facilitate setting the upper and lower limit saturation voltages of the output voltage so as not to be within the respective diagnostic ranges.

The circuit according to the second embodiment is more advantageous than the circuit according to the first embodiment in that the source current driving capability of operational amplifier 21 and the sink current driving capability of operational amplifier 31 may be reduced according to the second embodiment as compared with according to the first embodiment, and therefore, the layout area for the circuit according to the second embodiment may be narrower with no problem than the layout area for the circuit according to the first embodiment.

However, NMOS transistor 23 amplifies the output from operational amplifier 21 and, in the same manner, PMOS transistor 33 amplifies the output from operational amplifier 21 according to the second embodiment. Therefore, the circuit according to the second embodiment has disadvantageous factors such that the circuit is sensitive to noises and that the circuit is unstable and liable to be brought into an oscillating state.

Therefore, in applying the invention, it is desirable to consider the merits and demerits of the signal amplifier circuits according to the first and second embodiments and to determine, after considering all the factors, to employ any of the signal amplifier circuits according to the first and second embodiments. By the choice described above, a signal amplifier circuit that meets the demands and provides exact solutions will be obtained.

Third Embodiment

Figure 7:
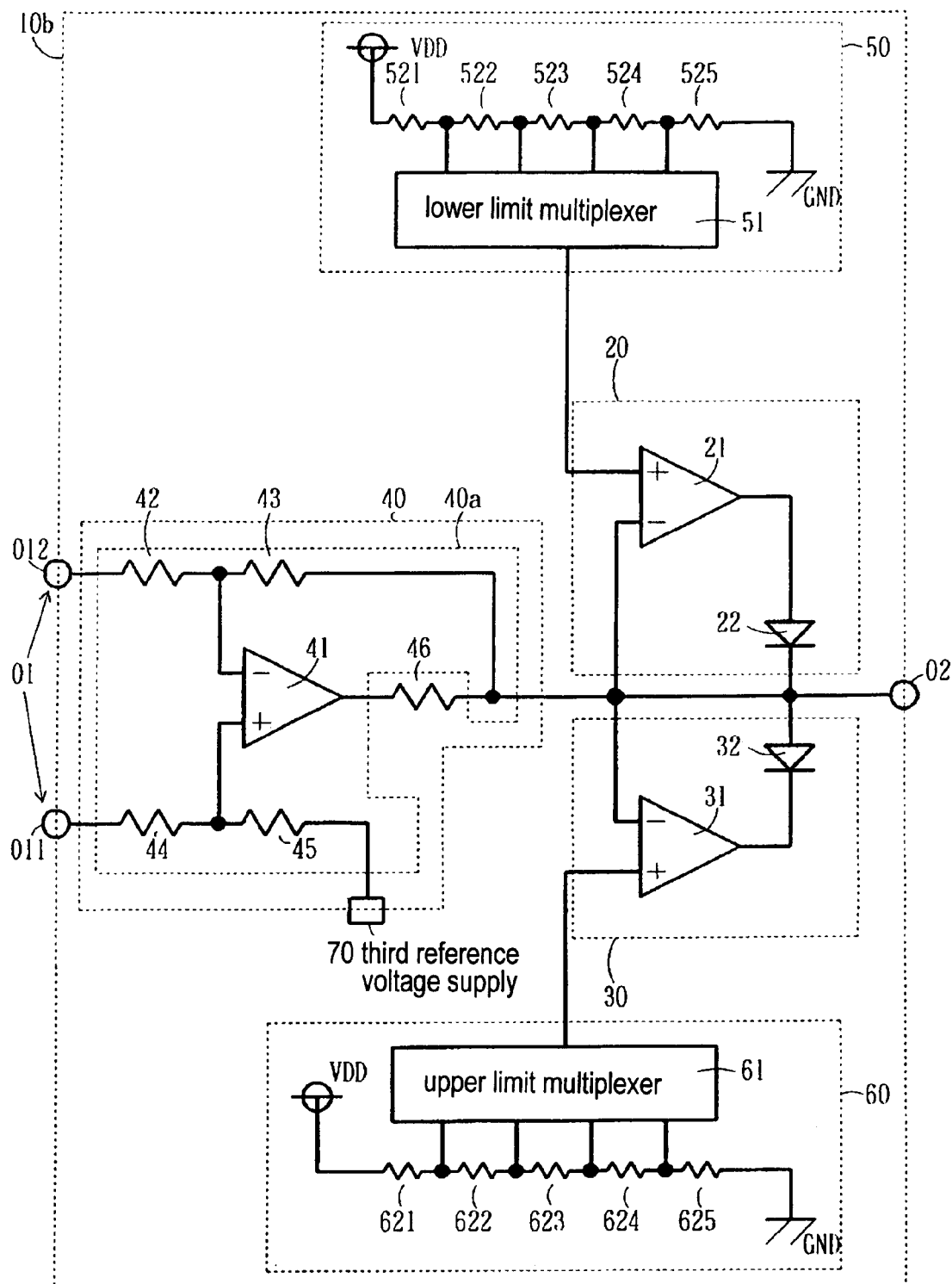
FIG. 7 is a block diagram of a signal amplifier circuit according to a third embodiment of the invention.

FIG. 7 illustrates a block diagram of a signal amplifier circuit 10b according to the third embodiment of the invention and includes many voltages prepared in advance such that the voltages may be outputted any time, first reference voltage supply 50, and second reference voltage supply 60. First reference voltage supply 50 includes a reference voltage selecting circuit including lower limit multiplexer 51 that selects one of the many voltages. Second reference voltage supply 60 includes a second reference voltage selecting circuit including upper limit multiplexer 61 that selects one of the many voltages.

In other words, signal amplifier circuit 10b includes signal amplifier circuit 10a according to the first embodiment and first reference voltage supply 50 including lower limit multiplexer 51 and dividing resistors 521 through 525, and second reference voltage supply 60 including upper limit multiplexer 61 and dividing resistors 621 through 625.

Dividing resistors 521 through 525 are connected in series between the VDD terminal and the GND terminal. Dividing resistors 621 through 625 are connected in series between the VDD terminal and the GND terminal. The voltage dividing points (connection points) of the resistors are inputted to lower limit multiplexer 51 or upper limit multiplexer 61.

Further, lower limit multiplexer 51 selects one of the voltages inputted by the dividing resistors and outputs the selected voltage to operational amplifier 21 in lower limit voltage limiting circuit 20. Upper limit multiplexer 61 selects one of the voltages inputted by the dividing resistors and outputs the selected voltage to operational amplifier 31 in upper limit voltage limiting circuit 30.

The circuit configuration described above facilitates selecting the lower and upper limit saturation voltages meeting the customers' demands.

The circuit configuration described above facilitates preparing many saturation voltages by one single circuit. Therefore, it is not necessary to design new signal amplifier circuits for the newly demanded saturation voltages. The circuit configuration described above facilitates rationalizing the manufacturing method and widening the fields, to which the circuit products are applied.

Figure 8:
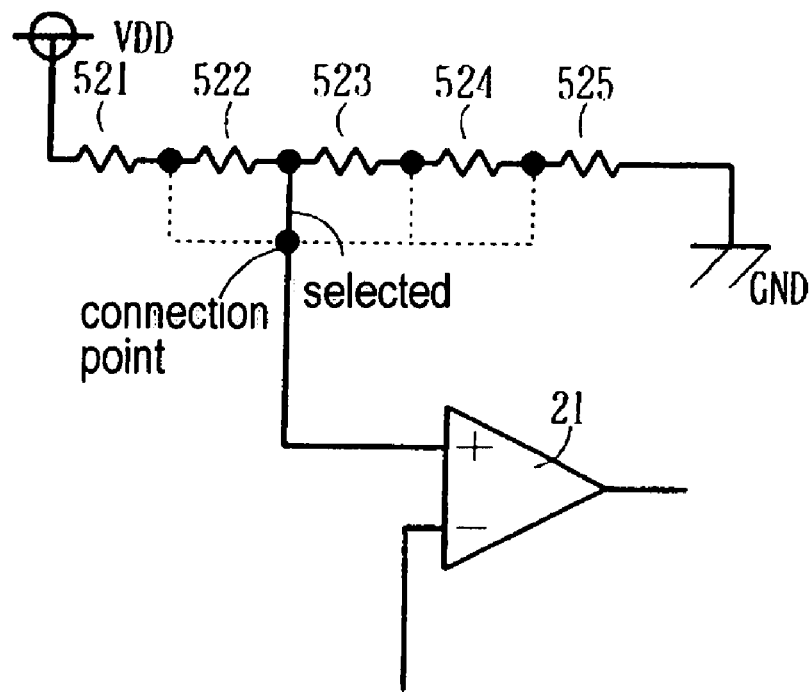
FIG. 8 is a diagram describing the mask-ROM-type reference voltage selecting means.
Figure 9:
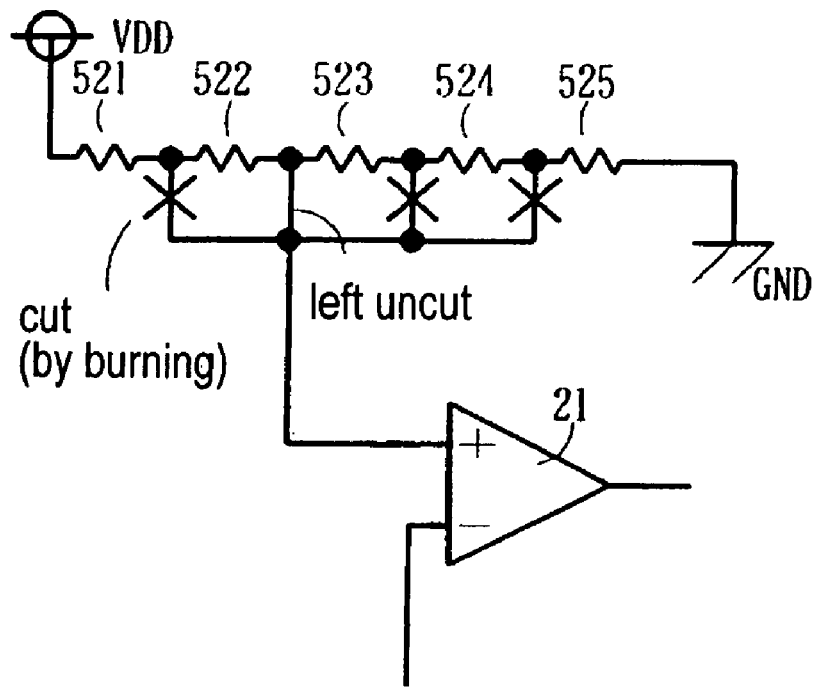
FIG. 9 is a diagram describing the laser-trimming-type reference voltage selecting means and the burning-type reference voltage selecting means that selectively cuts the unnecessary wirings with a current and such means.
Figure 10:
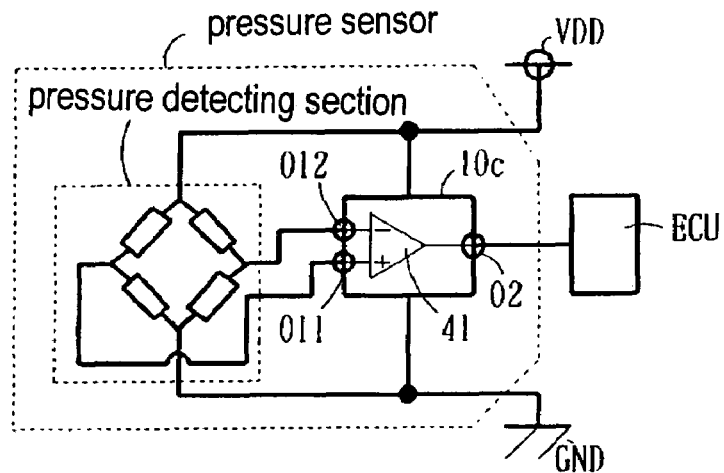
FIG. 10 is a block diagram of a conventional pressure sensor.

The reference voltage selection has been described above in connection with multiplexers 51 and 61 as selecting means. Alternatively, a mask-ROM-type selecting means that selects the connection point by changing the photomask at the stage of manufacture as shown in FIG. 8, a laser-trimming-type selecting means that prepares wirings in advance as shown in FIG. 9 and selectively burns to cut the unnecessary wirings (the X marks in FIG. 9) by a laser beam irradiation, and a fuse-ROM-type selecting means that prepares wirings in advance as shown in FIG. 9 and selectively cut the unnecessary wirings (the X marks in FIG. 9) with a current and such means are effective to rationalize the circuit design and manufacture.

Although the third embodiment has been described in connection with the signal amplifier circuit according to the first embodiment, the main configuration according to the third embodiment may be applicable to the signal amplifier circuit according to the second embodiment.

The disclosure of Japanese Patent Application No. 2006-116583 filed on Apr. 20, 2006 is incorporated by reference in its entirety.

While the invention has been explained with reference to the specific embodiments of the invention, the explanation is illustrative and the invention is limited only by the appended claims.

What is claimed is:

1. A signal amplifier circuit comprising:
a negative feedback amplifier circuit comprising an output terminal;
first voltage limiting means for limiting output voltage from the negative feedback amplifier circuit;
second voltage limiting means for limiting the output voltage from the negative feedback amplifier circuit;
a first reference voltage supply for applying a first reference voltage to the first voltage limiting means;
a second reference voltage supply for applying a second reference voltage to the second voltage limiting means;
wherein the first voltage limiting means is configured to discharge a source current to the output terminal of the negative feedback amplifier circuit when the output voltage from the negative feedback amplifier circuit exceeds the first reference voltage to a lower side, thereby fixing a lower limit saturation voltage at the first reference voltage; and
the second voltage limiting means is configured to draw a sink current from the output terminal of the negative feedback amplifier circuit when the output voltage from the negative feedback amplifier circuit exceeds the second reference voltage to a higher side, thereby fixing an upper limit saturation voltage at the second reference voltage.

2. The signal amplifier circuit according to claim 1, wherein the first voltage limiting means comprises a first operational amplifier and a first diode;
the output terminal of the negative feedback amplifier circuit is connected to an inverting input terminal of the first operational amplifier;
the first reference voltage supply is connected to a non-inverting input terminal of the first operational amplifier;
an anode terminal of the first diode is connected to an output terminal of the first operational amplifier;
a cathode terminal of the first diode is connected to the output terminal of the negative feedback amplifier circuit;
the second voltage limiting means comprises a second operational amplifier and a second diode;
the output terminal of the negative feedback amplifier circuit is connected to an inverting input terminal of the second operational amplifier;
the second reference voltage supply is connected to a non-inverting input terminal of the second operational amplifier;
a cathode terminal of the second diode is connected to the output terminal of the second operational amplifier; and
an anode terminal of the second diode is connected to the output terminal of the negative feedback amplifier circuit.

3. The signal amplifier circuit according to claim 1, wherein the first voltage limiting means comprises a first operational amplifier and an NMOS transistor;
the output terminal of the negative feedback amplifier circuit is connected to an inverting input terminal of the first operational amplifier;
the first reference voltage supply is connected to a non-inverting input terminal of the first operational amplifier;
a gate terminal of the NMOS transistor is connected to an output terminal of the first operational amplifier;
a source terminal of the NMOS transistor is connected to the output terminal of the negative feedback amplifier circuit;
a back gate terminal of the NMOS transistor is connected to a ground terminal;
a drain terminal of the NMOS transistor is connected to a power supply terminal;
the second voltage limiting means comprises a second operational amplifier and a PMOS transistor;
the output terminal of the negative feedback amplifier circuit is connected to an inverting input terminal of the second operational amplifier;
the second reference voltage supply is connected to a non-inverting input terminal of the second operational amplifier;
a gate terminal of the PMOS transistor is connected to an output terminal of the second operational amplifier;
a source terminal of the PMOS transistor is connected to the output terminal of the negative feedback amplifier circuit;
a drain terminal of the PMOS transistor is connected to a ground terminal; and
a back gate terminal of the PMOS transistor is connected to the power supply terminal.

4. The signal amplifier circuit according to claim 2, wherein the negative feedback amplifier circuit further comprises a third operational amplifier, first through fifth resistors, a positive input terminal, a negative input terminal, and a third reference voltage supply, wherein:
the first resistor comprises a first end connected to the negative input terminal and a second end connected to a first end of the second resistor;
the third resistor comprises a first end connected to the positive input terminal and a second end connected to a first end of the fourth resistor;
a connection point of the first and second resistors is connected to an inverting input terminal of the third operational amplifier;
a connection point of the third and fourth resistors is connected to a non-inverting input terminal of the third operational amplifier;
the fifth resistor comprises a first end connected to the output from the third operational amplifier and a second end connected to a second end of the second resistor;
a connection point of the second and fifth resistors is connected to the output terminal of the negative feedback amplifier circuit; and
a second end of the fourth resistor is connected to the third reference voltage supply.

5. The signal amplifier circuit according to claim 4, wherein:
a source current value of the first operational amplifier is equal or greater than a value obtained from ((the first reference voltage−a lower limit saturation voltage of the third operational amplifier)÷a resistance value of the fifth resistor); and
a sink current value of the second operational amplifier is equal or greater than a value obtained from ((an upper limit saturation voltage of the third operational amplifier−the second reference voltage)÷a resistance value of the fifth resistor).

6. The signal amplifier circuit according to claim 3, wherein
the negative feedback amplifier circuit further comprises a third operational amplifier, first through fifth resistors, a positive input terminal, a negative input terminal, and a third reference voltage supply, wherein;
the first resistor comprises a first end connected to the negative input terminal and a second end connected to a first end of the second resistor;
the third resistor comprises a first end connected to the positive input terminal and a second end connected to a first end of the fourth resistor;
a connection point of the first and second resistors is connected to an inverting input terminal of the third operational amplifier;
a connection point of the third and fourth resistors is connected to a non-inverting input terminal of the third operational amplifier;
the fifth resistor comprises a first end connected to the output from the third operational amplifier and a second end connected to a second end of the second resistor;
a connection point of the second and fifth resistors is connected to the output terminal of the negative feedback amplifier circuit; and
a second end of the fourth resistor is connected to the third reference voltage supply.

7. The signal amplifier circuit according to claim 6, wherein:
a source current value of the NMOS transistor is equal to or grater than a value obtained from ((the first reference voltage−a lower limit saturation voltage of the third operational amplifier)÷a resistance value of the fifth resistor); and a sink current value of the PMOS transistor is equal to or greater than a value obtained from ((an upper limit saturation voltage of the third operational amplifier−the second reference voltage)÷a resistance value of the fifth resistor).

8. The signal amplifier circuit according to claim 1, wherein the first reference voltage supply and/or the second reference voltage supply comprise voltage selecting means for selecting one voltage out of two or more voltages generated by voltage dividing resistors.

9. The signal amplifier circuit according to claim 8, wherein the voltage selecting means comprises a multiplexer.

10. The signal amplifier circuit according to claim 8, wherein the voltage selecting means selects a photomask operable to form a metal wiring connected to predetermined voltage dividing resistors and to select a predetermined reference voltage.

11. The signal amplifier circuit according to claim 8, wherein the voltage selecting means cuts the metal wirings connected to unnecessary voltage dividing resistors using heat generated by a laser beam or by a current, thereby to leave metal wiring connected to the predetermined resistors and to select a predetermined reference voltage.

* * * * *

UNITED STATES PATENT AND TRADEMARK OFFICE
CERTIFICATE OF CORRECTION

PATENT NO. : 7,525,389 B2
APPLICATION NO. : 11/783327
DATED : April 28, 2009
INVENTOR(S) : Mutsuo Nishikawa et al.

Page 1 of 1

It is certified that error appears in the above-identified patent and that said Letters Patent is hereby corrected as shown below:

Please start a new line from column 2, line 57, "Voltage drop", and change column 4, line 1, "before teaching the diagnostic ranges." to --before reaching the diagnostic ranges--.

Signed and Sealed this

Seventh Day of July, 2009

JOHN DOLL
*Acting Director of the United States Patent and Trademark Office*